(12) United States Patent
Peczalski

(10) Patent No.: US 7,926,193 B2
(45) Date of Patent: Apr. 19, 2011

(54) NANOWIRE MAGNETIC SENSOR

(75) Inventor: Andrzej Peczalski, Eden Prairie, MN (US)

(73) Assignee: Honeywell International Inc., Morristown, NJ (US)

(*) Notice: Subject to any disclaimer, the term of this patent is extended or adjusted under 35 U.S.C. 154(b) by 0 days.

(21) Appl. No.: 12/640,571

(22) Filed: Dec. 17, 2009

(65) Prior Publication Data
US 2010/0223797 A1 Sep. 9, 2010

Related U.S. Application Data

(63) Continuation-in-part of application No. 12/184,772, filed on Aug. 1, 2008.

(51) Int. Cl.
*G01C 17/02* (2006.01)

(52) U.S. Cl. ..................... 33/355 R; 33/356

(58) Field of Classification Search .............. 33/355 R, 33/356–357, 351–352, 316; 702/92–94; 324/244, 260
See application file for complete search history.

(56) References Cited

U.S. PATENT DOCUMENTS

| 5,521,501 | A | 5/1996 | Dettmann et al. |
| 5,714,536 | A | 2/1998 | Ziolo et al. |
| 5,889,091 | A | 3/1999 | Ziolo et al. |
| 6,373,242 | B1 | 4/2002 | Wappling |
| 2007/0297102 | A1 | 12/2007 | Gill |
| 2010/0024231 | A1* | 2/2010 | Peczalski ............ 33/355 R |
| 2010/0124091 | A1* | 5/2010 | Cowburn ............ 365/80 |

FOREIGN PATENT DOCUMENTS

| JP | 2002-310659 | 10/2002 |
| JP | 2004-205331 | 7/2004 |
| JP | 2006-010591 | 1/2006 |

OTHER PUBLICATIONS

U.S. Appl. No. 12/184,772, filed Aug. 1, 2008, entitled "Nanowire Magnetic Compass and Position Sensor", by Peczalski et al.
International Search Report and Written Opinion from corresponding PCT Application Serial No. PCT/US2009/052359, mailed Mar. 9, 2010, 6 pages.

* cited by examiner

*Primary Examiner* — G. Bradley Bennett
*Assistant Examiner* — Tania C Courson
(74) *Attorney, Agent, or Firm* — Fogg & Powers LLC

(57) ABSTRACT

A nanowire magnetic sensor includes an array of magnetoresistive (MR) nanosensors with each MR nanosensor including a set of MR nanowires that are all aligned in the same position for one direction. The substrate can be a flexible substrate bent into a circular configuration for compass applications. A plurality of individual nanosensors can be connected into resistive Wheatstone bridge configurations by metallization.

17 Claims, 5 Drawing Sheets

NANOWIRE MAGNETIC SENSOR

CROSS REFERENCE TO RELATED APPLICATIONS

This application is a continuation-in-part (CIP) of U.S. Non-provisional application Ser. No. 12/184,772 filed Aug. 1, 2008, which is herein incorporated by reference in its entirety.

TECHNICAL FIELD

Disclosed embodiments are generally related to magnetic sensors having a plurality of sensing elements.

BACKGROUND

Various types of equipment and systems for assisting in navigation and determining the location of a vehicle such as a boat, truck, automobile or airplane are known to the art. Such equipment and systems include various sensors for magnetic-effect sensing. Examples of common magnetic-effect sensors include Hall effect and magneto-resistive (MR) technologies. Such magnetic sensors can generally respond to a change in the magnetic field as influenced by the presence or absence of a ferromagnetic target object of a designed shape passing by the sensory field of the magnetic-effect sensor. The sensor can then provide an electrical output, which can be further modified as necessary by electronics to yield sensing and control information. The electronics may be located either onboard or outboard of the sensor package.

Various types of non-contact devices are presently available for measuring distance and detecting the linear or rotational position of an object. A magnetic compass is a navigational instrument for finding directions on the earth. A magnetic compass includes a magnetized pointer free to align itself accurately with earth's magnetic field, which is of great assistance in navigation. The face of the compass generally highlights the cardinal points of north, south, east and west. Magnetic position sensors utilized by the magnetic compass measure the direction and magnitude of magnetic fields by employing the MR effect. Such sensors include two galvanic separated Wheatstone bridges for sensing the position of a magnetic object. Such magnetic position sensors are generally non-contact sensors. As the magnetized pointer approaches the sensing device, the magnetic field of the pointer is detected and the sensing device generates an electrical signal that is then used for counting, display purposes, recording and/or control purposes.

Navigation generally requires a magnetic compass having an angular resolution of 0.01 to 0.001 degree or better for precise position determination, especially in a Global Positioning System (GPS) denied environment. Similarly, relative versus absolute azimuth resolution of the magnetic compass must also be high. Conventional magnetic position sensors provide a precision of about 0.1 degree, are expensive, and are limited to an accuracy of about 5.5 millidegrees (i.e., 16 bits).

BRIEF SUMMARY

This Summary is provided to comply with 37 C.F.R. §1.73, presenting a summary of the disclosed embodiments to briefly indicate the nature and substance disclosed herein. It is submitted with the understanding that it will not be used to interpret or limit the scope or meaning of the claims.

Nanowire magnetic compasses and position sensors for determining the position of a magnetic object or direction of a magnetic field are disclosed herein. Embodied as a magnetic compass, the magnetic compass includes an array of MR nanosensors on a flexible substrate, which cover the full 360-degree angle, in one embodiment at equal intervals. Each MR nanosensor generally includes MR nanowires with high magnetic sensitivity arranged in sets that are each aligned in the same position for one direction (e.g., aligned vertically), such as 2 to 50 MR nanowires aligned in the vertical direction on the substrate for each MR nanosensor. A plurality of nanosensors can be connected into resistive Wheatstone bridge configurations by metallization. In another embodiment, the array of MR nanosensors can be utilized as a position sensor for a magnetic object or an object having a magnet affixed thereon for position determination of the object.

Embodied as a compass, using a flexible substrate, the azimuth resolution and sensitivity of the compass can be increased by bending the flexible substrate to form a circular configuration. Each of the groups of MR nanowires for each of the MR nanosensor in the array will point at a different azimuth direction that is determined by the number of the nanosensors (e.g., 100 groups of nanosensors can cover 360 degrees in 3.6 degree intervals). Knowledge of that interval helps to increase precision of the magnetic compass. Additional electronics, such as preamplifiers, can also be provided on the substrate.

Individual nanosensors in the array can be connected into resistive bridge configuration. The MR nanowires can comprise Anisotropic Magneto-Resistive (AMR), Giant Magneto-resistive (GMR), colossal magnetoresistive, or tunneling magnetoresistive nanowires. By utilizing multiple nanosensors, the capability of extended angular or linear position measurements can be enhanced. The output of the resistive bridges can be aggregated in order to obtain high precision. For compass applications, a circular configuration can be formed with a diameter of 0.05 to 50 mm, such as on the order of 1 mm. Disclosed nanowire magnetic compasses and position sensors sensitive, low field, solid-state and able to measure direction and magnitude of earth's magnetic fields with high resolution

DETAILED DESCRIPTION

Figure 1A:
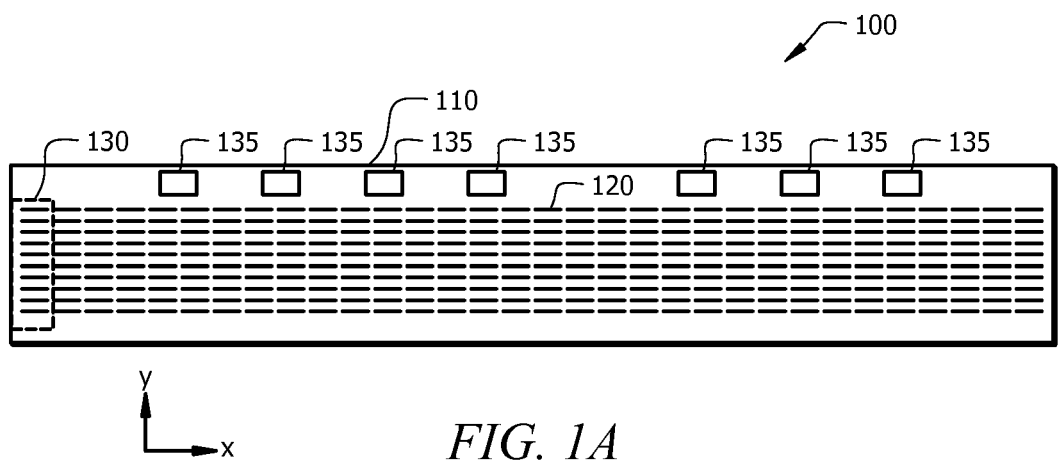
FIG. 1A illustrates a top view of a nanowire magnetic sensor comprising an array of MR nanosensors with each MR nanosensor comprising a set of MR nanowires for linear sensing, according to a first disclosed embodiment.

Disclosed embodiments are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments. One having ordinary skill in the relevant art, however, will readily recognize that the disclosed embodiments can be practiced without one or more of the specific details or with other methods. In other instances, well-known structures or operations are not shown in detail to avoid obscuring the disclosed embodiments. The disclosed embodiments are not limited by the illustrated ordering of acts or events, as some acts may occur in different orders and/or concurrently with other acts or events. Furthermore, not all illustrated acts or events are required to implement a methodology in accordance with disclosed embodiments.

FIG. 1A illustrates a top view of a nanowire magnetic sensor apparatus 100 comprising a substrate 110. Apparatus 100 comprises an array of MR nanosensors 130, with each MR nanosensor 130 comprising at least one MR nanowire 120, with sets of 10 MR nanowires 120 per MR nanosensor 130 shown as an example in FIG. 1A. MR nanowires 120 have a nanoscale width (vertical is the y-direction shown in FIG. 1A), such as 5 to 200 nm in diameter, and a length in the other direction (horizontal is the x-direction shown in FIG. 1A), that is larger, such as 500 nm to 10 μm. Electronic components 135, are also shown on substrate 110, such as comprising filters, amplifiers and for Wheatstone bridge circuits.

As shown in FIG. 1A, wherein the substrate 110 is a planar substrate, apparatus 100 can be used for linear position sensing. In another embodiment, such as for use as a compass, the substrate 110 comprises a flexible substrate. As used herein, the term "flexible substrate" is defined as a substrate that can be at least 1 micron thick and still be bent into a circular configuration without fracture. Exemplary substrate materials include silicon with thickness <100 μms, flex board such as the flexible circuit board that is typically 1-5 mm thick commonly used in electronic products, and a polyimide film with thickness generally between 10-10,000 μms.

Embodied as a flexible substrate, the flexible substrate can be bent into a circular configuration apparatus for use as a compass for covering a 360-degree angle at equal intervals. For compass applications, the substrate 110 generally comprises a flexible substrate 110. The sets of MR nanowires 120 for each MR nanosensor 130 are shown in FIG. 1A to be aligned in the same position for one direction (shown as the y-direction), and thus can be referred to as being in a linear array.

The MR nanowires 120 can be printed and patterned on the flexible substrates 110 by photolithography or printing technique. Photolithography printing involves the deposition of a layer of photosensitive material on a semiconductor substrate, exposure of the photosensitive material through a mask, and development of the exposed photosensitive layer. Exposure is typically carried out in a scanner or stepper tool, wherein an exposure slit is passed across the surface of the substrate, thereby sequentially exposing narrow strips of the photosensitive layer. It can be appreciated that other types of printing techniques may also be utilized to print MR nanowires 120 on the flexible substrate 110, depending upon design considerations.

Since each MR nanosensor 130 shown in FIG. 1A includes a set (shown as 10 as an example) of MR nanowires 120, the variability of each MR nanosensor 130 is reduced as compared to conventional single MR nanowire-based nanosensors. As described above, the MR nanowires 120 can comprise AMR, GMR or other MR nanowires, e.g. colossal magnetoresistive or tunneling magnetoresistive nanowires. For example, AMR occurs in certain ferrous materials such as permalloy and can be applied as a thin strip to become a resistive element. The AMR effect changes an electrical resistance of a MR element in proportion to a square of a cosine of an angle formed between the magnetization of the MR element and the direction in which a sense current that flows through the element is conducted. The GMR effect, in particular, a spin-valve effect in which a resistance change of an element through which a sense current is flowing is generated due to a spin-dependence scattering that occurs at the interfaces of magnetic and nonmagnetic respective layers. The GMR effect does not depend on the angle between the current flow and magnetic field.

Apparatus 100 can be utilized as a position sensor for determining the position of a magnetic object with the precision determined by the length of each MR nanosensor 130 shown as being in the x-direction in FIG. 1A, for e.g., 0.5-10 micron. The length and locations of the MR nanowires 120 can be precisely determined with a photolithography printing process. The size of the array of MR nanosensors 130 and the small dimension in the x-direction of the MR nanowires 120 shown in FIG. 1A enables very high resolution of about 1-0.1 millidegree. It should be appreciated that FIGS. 1A-8 are only exemplary and are not intended to assert or imply any limitation with regard to the environments in which aspects or disclosed embodiments may be implemented.

Figure 1B:
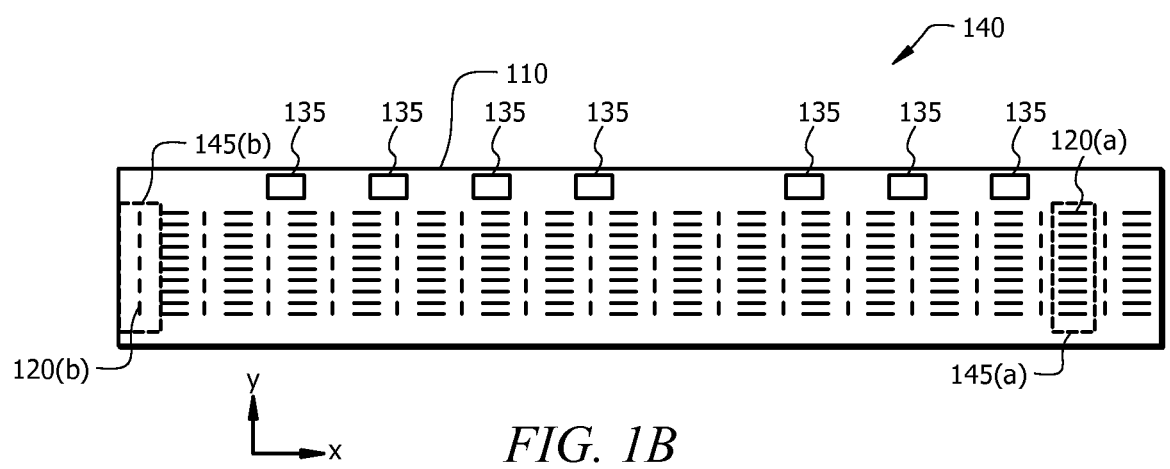
FIG. 1B illustrates a top view of a nanowire magnetic sensor comprising an array of MR nanosensors with each MR nanosensor comprising a set of MR nanowires for 2D sensing, according to another disclosed embodiment.

FIG. 1B illustrates a top view of a nanowire magnetic sensor 140 comprising an array of MR nanosensors comprising MR nanosensors 145(a) that comprise sets of MR nanowires 120(a) and MR nanosensors 145(b) that comprise sets of MR nanowires 120(b), for 2D sensing, according to another disclosed embodiment. As shown, the MR nanosensors in the array alternate between being in a first orientation (horizontal nanowires 120(a), shown as MR nanosensors 145(a)) and a second orthogonal orientation (vertical nanowires 120(b), shown as MR nanosensors 145(b)).

Figure 1C:
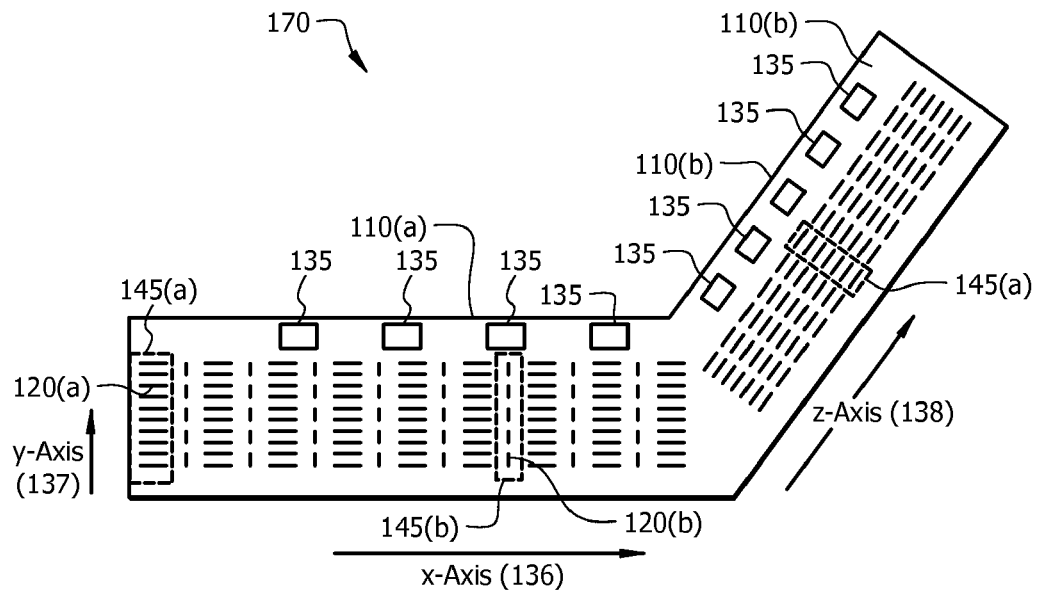
FIG. 1C illustrates a perspective view of a nanowire magnetic sensor comprising an array of MR nanosensors each with each MR nanosensor comprising a set of MR nanowires for 3D sensing, according to yet another disclosed embodiment.

FIG. 1C illustrates a perspective view of a nanowire magnetic sensor 170 comprising array of MR nanosensors comprising MR nanosensors 145(a) that comprise sets of MR nanowires 120(a) and MR nanosensors 145(b) that comprise sets of MR nanowires 120(b), for 3D sensing, according to yet another disclosed embodiment. As shown, the substrate is in the form of a twisted flat ribbon, so that a part of the substrate 110(a) is orientated along the horizontal (x-y) plane and has the pattern shown in FIG. 1B for 2D sensing along the x-axis 136 and along y-axis 137, while the other part of substrate 110(b) includes MR nanosensors 145(a) positioned and oriented for sensing along the z-axis 138.

Figure 1D:
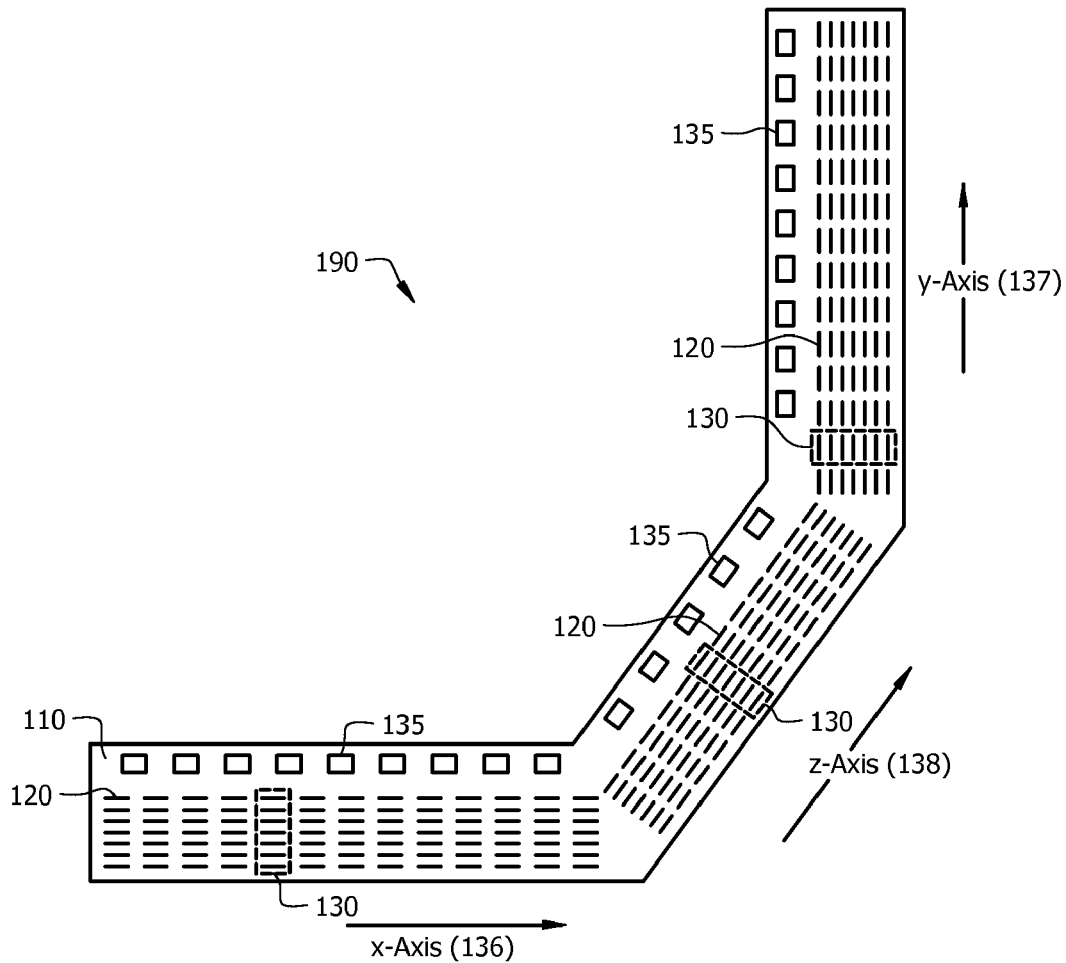
FIG. 1D illustrates a perspective view of a nanowire magnetic sensor comprising an array of MR nanosensors with each MR nanosensor comprising a set of MR nanowires for 3D sensing, according to another disclosed embodiment.

FIG. 1D illustrates a perspective view of a nanowire magnetic sensor 190 comprising an array of MR nanosensors 130 each comprising a set of MR nanowires 120 for 3D sensing, according to another disclosed embodiment. Nanowire magnetic sensor 190 positions the MR nanosensors 130 for x, y, z coverage (along x-axis 136, y-axis 137, and z-axis 138) by twisting a ribbon such as shown in FIG. 1A as a corkscrew by 90 degrees and then twisting again to provide to provide 3D sensing. Yet another arrangement to achieve x, y, z coverage is to stand a second ribbon with nanowires on its side using the support of a vertical side of a package.

Figure 2:
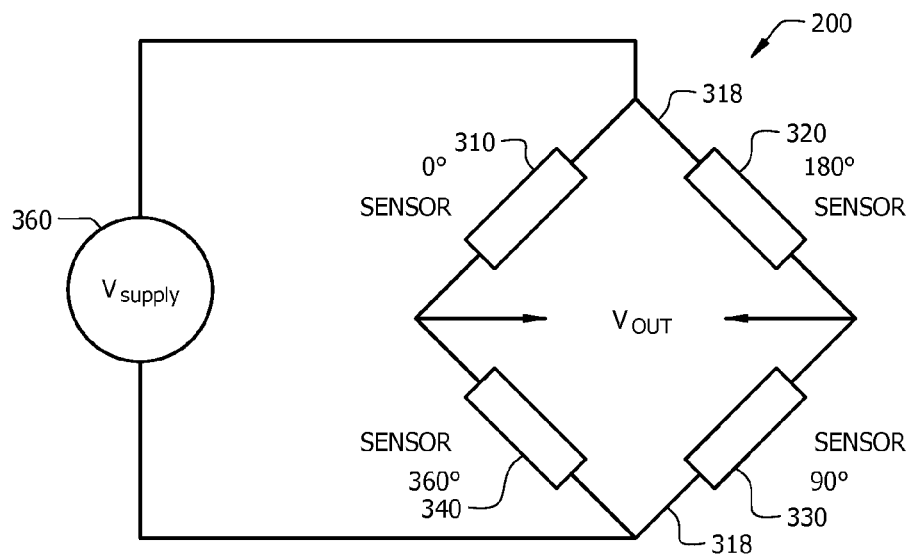
FIG. 2 illustrates a schematic diagram of a Wheatstone bridge circuit utilizing AMR nanowire sensors, in accordance with another disclosed embodiment.

FIG. 2 illustrates a schematic diagram of a Wheatstone bridge circuit 200 utilizing a plurality (shown as 4) of MR nanosensors shown in FIGS. 1A-D embodied as AMR nanosensors, wherein the substrate is a flexible substrate and the apparatus is bent into a circular configuration for compass applications, in accordance with a disclosed embodiment. Note that in FIGS. 1A-8, identical or similar parts are generally indicated by identical reference numerals. The AMR nanosensors 310, 320, 330 and 340 associated with the apparatus 100 each include sets of AMR nanowires, such as nanowires 120 described above. Metallization 318 connects the respective nanowires electrically in parallel. to form each AMR nanosensor 310, 320, 330 and 340 and interconnects AMR nanosensors 310, 320, 330 and 340 into the Wheatstone bridge circuit 200 configuration. Each of the AMR nanosensors 310, 320, 330 and 340 possesses an ability to change its resistance in a $(\cos(a))^2$ relationship where 'a' refers to the magnetic field angle with respect to the current flow direction in the MR element. The top and bottom connections of the four AMR nanosensors 310, 320, 330 and 340 can be given a direct current (DC) stimulus based on application of a supply voltage 360, with the remaining side connections to be measured. The side contacts can be at the same voltage, except for a small offset voltage due to manufacturing tolerances on the AMR elements when no magnetic field is supplied. The side contacts will produce a differential voltage as a function of the supply voltage 360, MR ratio, and the magnetic field angle 'a'. High precision has been found to be obtained by aggregating outputs of a plurality of bridges, such as a plurality of the Wheatstone bridge circuits 200 shown in FIG. 2.

The arrangement for achieving high sensitivity of the individual nanowires in the Wheatstone bridge is different for AMR with $\cos^2$ angle between nanowire axis (current direction) and magnetic field dependence and GMR with $(1-\cos(a))/2$ dependence where 'a' is an angle between the nanowire axis and magnetic field. For example the AMR configuration may involve the nanosensors 320, 330, 340, and 310 of FIG. 2 to be at 180°, 90°, 360°, and 0° position, respectively. It should be noted that this configuration is identical with the diamond-like configuration typical in case of just four magnetic sensors. Whereas the GMR sensors 320, 330, 340, and 310 may be connected in the positions corresponding to 0, 180, 90, 270 degrees.

Figure 3:
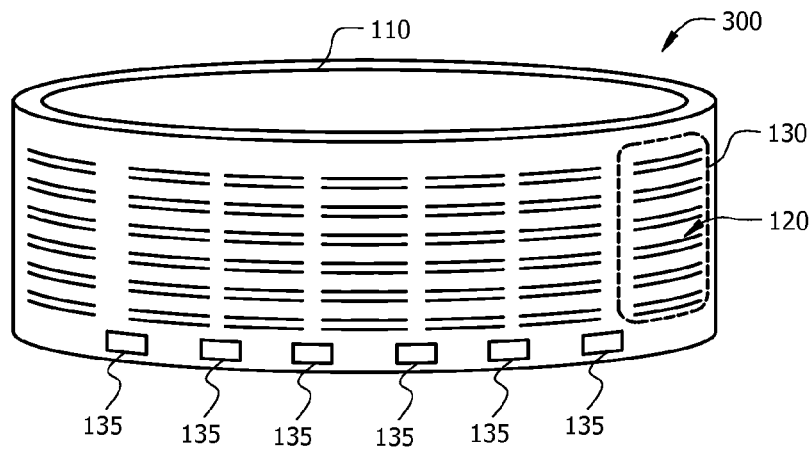
FIG. 3 illustrates a perspective view of the nanowire magnetic compass in a circular configuration, in accordance with another embodiment.

FIG. 3 illustrates a perspective view of the magnetic sensor apparatus 100 shown in FIG. 1A in the case the substrate is a flexible substrate and the substrate is bent into a circular configuration to form a nanowire magnetic compass 300, in accordance with a disclosed embodiment. The MR nanosensors 130 in the circular configuration 300 detect the azimuth direction of magnetic field with a resolution generally exceeding 0.001 degree.

Figure 4:
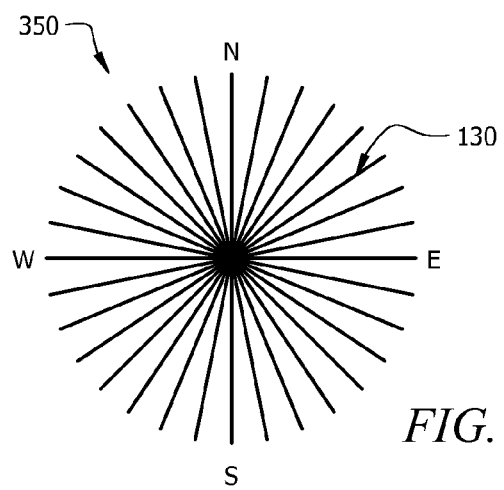
FIG. 4 illustrates an equivalent magnetic field direction determined by the nanowire configuration of FIG. 3.

FIG. 4 illustrates a perspective view of the nanosensors in correspondence with the magnetic field direction 300, which can be implemented in accordance with a disclosed embodiment. The MR nanosensors 130 in the circular configuration 300 corresponds to the magnetic field direction as indicated as N, S, E and W generally highlights the cardinal points of north, south, east and west or positions of 0, 90, 180 and 270 degrees in notation use above.

Figure 5:
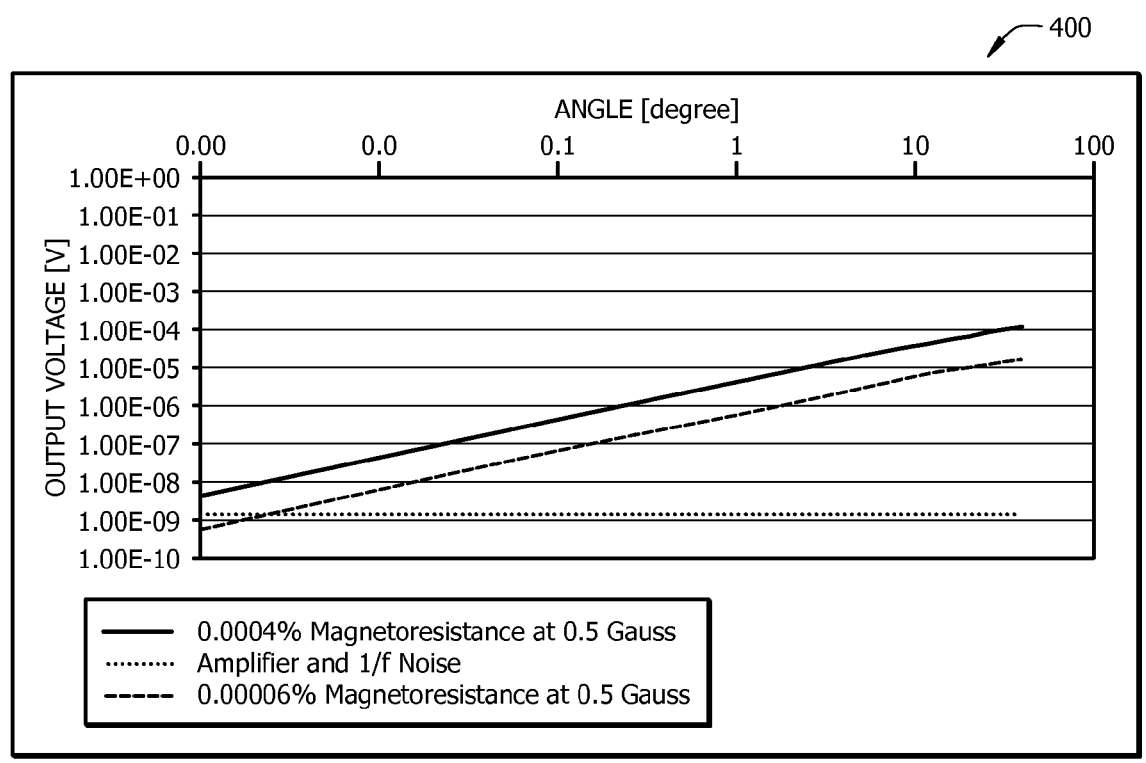
FIG. 5 illustrates a graphical representation illustrating the performance of a AMR nanowire magnetic compass, in accordance with a disclosed embodiment.

FIG. 5 illustrates a graphical representation 400 illustrating the performance of the AMR nanowire magnetic compass 300, in accordance with a disclosed embodiment. The graphical representation 400 depicts the MR change with respect to the magnetic field angle 'a', as $(\cos(a))^2$ with amplitude 0.0004% and 0.00006% with Cobalt (Co) nanowires. As in indicated in the table shown in FIG. 5, the AMR nanowires 120 described with respect to FIG. 4, generate about a 1% magnetoresistance change, which may exceed sensitivity of 1 millidegree. Similarly, the power dissipation of a nanowire sensor apparatus comprising 360 nanosensors comprised of 90 resistive bridges (4 nanosensors/bridge), with each nanosensor comprising 10 MR nanowires, with the MR nanowires 80 nm in diameter, and 10 micron long can be only 30 mW at 1 V bias.

Figure 6:
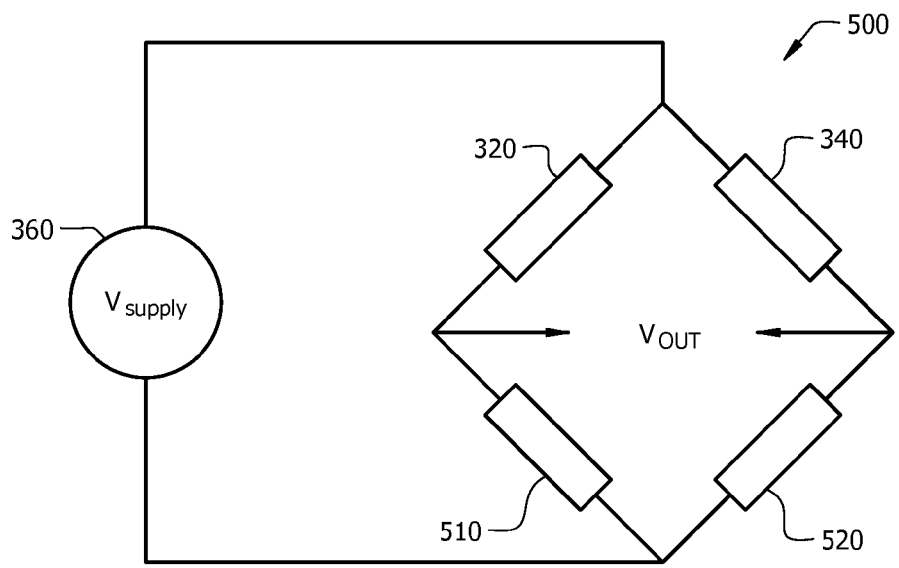
FIG. 6 illustrates a schematic diagram of a Wheatstone bridge circuit utilizing GMR nanowire sensors, in accordance with an alternative embodiment.

FIG. 6 illustrates a schematic diagram of a Wheatstone bridge circuit 500 utilizing GMR nanowire sensors, in accordance with another disclosed embodiment. The nanosensors such as sensor 510, 320, 520 and 340 associated with the nanowire magnetic compass 300 includes GMR nanosensors each comprising a set of GMR nanowires 120 as four elements of the Wheatstone bridge circuit 500. The MR nanosensors 510, 320, 520 and 340 can be configured as a four-element Wheatstone bridge circuit to convert the sensed magnetic fields to differential output voltages. The four nanosensors 510, 320, 520 and 340 can be oriented as described above with their ends connected together by metallization to form the Wheatstone bridge circuit 500. The Wheatstone bridge circuit 500 generally includes passive components that do not emit any measurable electromagnetic fields or broadband noise.

Figure 7:
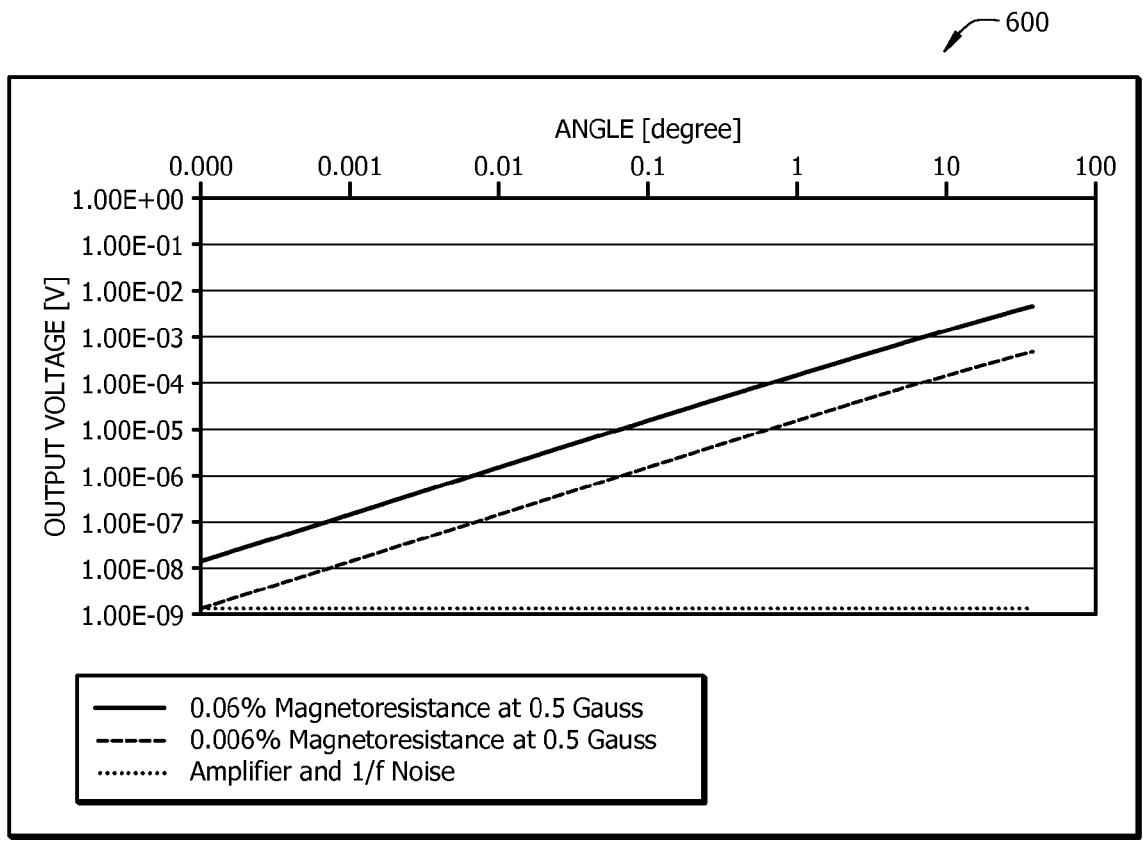
FIG. 7 illustrates a graphical representation illustrating the performance of a GMR nanowire magnetic compass, in accordance with an alternative embodiment.

FIG. 7 illustrates a graphical representation 600 illustrating performance of a GMR nanowire magnetic compass, in accordance with another disclosed embodiment. The graphical representation-600 depicts the MR change with respect to the magnetic field angle a, as $(1-\cos(a))/2$ with amplitude 0.06%, or 0.006% and with permalloy/Cu, 85 nm diameter nanowires. As depicted in the table in FIG. 7, the AMR nanowires 120 referred to in FIG. 4 generate 20% magnetoresistance change, which may exceed sensitivity of 1 millidegree. As noted above, the power dissipation for a nanowire sensor apparatus comprising 360 nanosensors comprising 90 Wheatstone bridge circuits, with each MR nanosensor 130 comprising 10 nanowires that are each 80 nm diameter and 10 microns long can be only 30 mW at 1 V bias.

Figure 8:
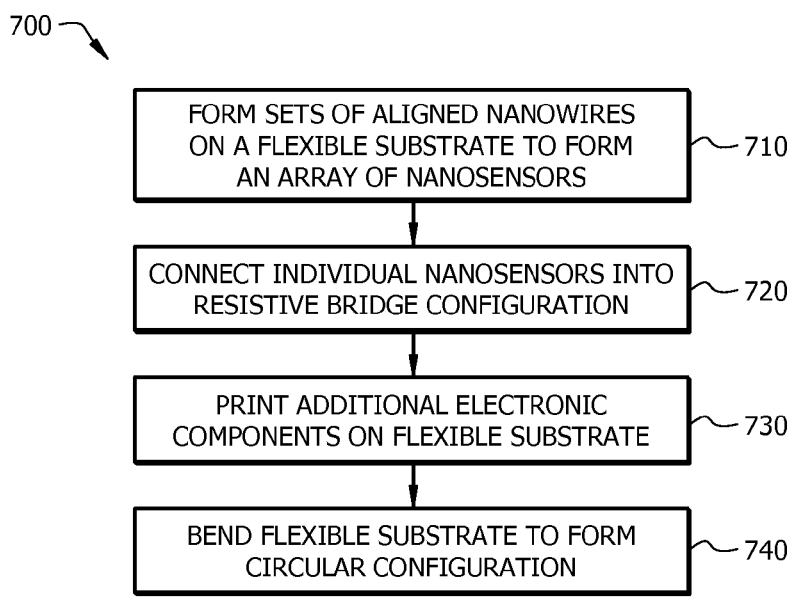
FIG. 8 illustrates a detailed flow chart of operations illustrating logical operational steps of a method for forming a nanowire compass, in accordance with a disclosed embodiment.

FIG. 8 demonstrates a flow chart of operations illustrating logical operational steps of a method 700 for forming a nanowire compass in accordance with a disclosed embodiment. The MR nanowires 120 can be printed or otherwise patterned on a substrate 110 in sets with each nanowire in the respective sets aligned in the same position for one direction to form an array of MR nanowires 120, as shown at block 710. Thereafter, as illustrated at block 720, the individual MR nanosensors 130 each comprising a set of MR nanowires can be connected into a resistive bridge configuration, such as by metallization into the Wheatstone bridge circuit 200 and 500. Additional electronic components, such as electronic components 135 shown in FIG. 1A, can also be mounted on the same substrate 110 utilizing other type of nanowires, as shown at block 730. The flexible substrate 110 can be bent to form a circular configuration 300, as depicted at block 740. The MR nanosensors 130 in the circular configuration 300 can determine the azimuth direction of a magnetic field with the resolution exceeding about 0.001 degree.

The MR nanosensors 130 in nanowire sensor apparatus according to disclosed embodiments can be designed to accurately detect the direction and magnitude of external magnetic fields for compassing and magnetometry applications. Such sensor apparatus extremely sensitive, low field, solid-state magnetic sensors in one application able to measure the direction and magnitude of earth's magnetic fields. Similarly, the size of the array of nanosensors 130 and the small dimension of the MR nanowires 120 enables very high resolution forming low cost sensors for compassing and position determination.

While various embodiments have been described above, it should be understood that they have been presented by way of example only, and not limitation. Numerous changes to the disclosed embodiments can be made in accordance with the disclosure herein without departing from the spirit or scope of the disclosed embodiments. Thus, the breadth and scope of the disclosed embodiments should not be limited by any of the above explicitly described embodiments. Rather, the scope of the invention should be defined in accordance with the following claims and their equivalents.

Although the disclosed embodiments have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting to embodiments of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which the disclosed embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. A method for fabricating a nanowire magnetic sensor, comprising:
    forming a plurality of magneto-resistive (MR) nanowires on a flexible substrate, wherein said plurality of MR nanowires are positioned to create an array of MR nanosensors, and wherein each of said MR nanosensors in said array comprises a set of said plurality of MR nanowires,
    wherein said MR nanowires in said sets are each aligned in the same position for one direction; and
    connecting said array MR nanosensors into at least one Wheatstone bridge configuration.

2. The method of claim 1 wherein said plurality of MR nanowires comprise giant magneto-resistive (GMR) nanowire, anisotropic magneto-resistive (AMR) nanowire, colossal magnetoresistive nanowire or tunneling magnetoresistive nanowire.

3. The method of claim 1 further comprising forming a plurality of supporting electronics including at least one Wheatstone Bridge on said substrate for sensing and electronics for control information.

4. The method of claim 1, wherein some of said sets include said MR nanowires aligned in a first position, and wherein others of said sets include said MR nanowires aligned in a second position that is perpendicular to said first position.

5. The method of claim 1, wherein a first portion of said sets include said MR nanowires aligned in a first position, and wherein a second portion of said sets include said MR nanowires aligned in a second position that is perpendicular to said first position, and wherein a third portion of said sets include said MR nanowires aligned in a third position that is perpendicular to both said first and second positions.

6. The method of claim 1, wherein said substrate comprises a flexible substrate, further comprising bending said flexible substrate into a circular configuration wherein each of said MR nanosensors in said array while in said circular configuration detect a different azimuth direction of a magnetic field.

7. The method of claim 6 wherein said plurality of MR nanosensors cover a 360-degree angle at equal angular intervals.

8. The method of claim 6, wherein said circular configuration of said flexible substrate defines a diameter of from 0.05-50 mm.

9. A nanowire magnetic sensor, comprising:
    a substrate;
    a plurality of magneto-resistive (MR) nanowires on said substrate;
    an array of MR nanosensors each comprising a set of said plurality of MR nanowires, wherein said MR nanowires in said sets are all aligned in the same position for one direction, and
    metal lines for interconnecting said plurality of MR nanosensors in said array.

10. The nanowire magnetic sensor of claim 9, wherein said substrate is configured so that a first portion of said sets include said MR nanowires aligned in a first position, a second portion of said sets include said MR nanowires aligned in a second position that is perpendicular to said first position, and a third portion of said sets include said MR nanowires aligned in a third position that is perpendicular to both said first and second positions, wherein said nanowire magnetic sensor comprises a 3D magnetic sensor.

11. The nanowire magnetic sensor of claim 9, wherein said substrate comprises a flexible substrate that is in a circular configuration, and wherein said nanowire magnetic sensor is a nanowire magnetic compass.

12. The nanowire magnetic sensor of claim 11, wherein said circular configuration has a diameter of 0.05-50 mm.

13. The nanowire magnetic sensor of claim 9, wherein said plurality of MR nanosensors each comprise at least ten of said MR nanowires.

14. The nanowire magnetic sensor of claim 9 wherein said plurality of MR nanowires comprise giant magneto-resistive (GMR) material anisotropic magneto-resistive (AMR) material, colossal magneto-resistive (CMR) material, or tunneling magnetoresistive material.

15. The nanowire magnetic sensor of claim 9 further comprising at least one Wheatstone bridge on said substrate, wherein individual ones of said array of magnetic nanosensors are connected to form said Wheatstone bridge by said metal lines.

16. The nanowire magnetic sensor of claim 9, wherein said nanowire magnetic sensor comprises a 2D magnetic sensor.

17. The nanowire magnetic sensor of claim 9, wherein said nanowire magnetic sensor comprises a 3D magnetic sensor.

* * * * *